United States Patent [19]
Westbrook

[11] Patent Number: 5,329,542
[45] Date of Patent: Jul. 12, 1994

[54] DISTRIBUTED FEEDBACK LASERS

[75] Inventor: Leslie D. Westbrook, Ipswich, England

[73] Assignee: British Telecommunications public limited company, London, England

[21] Appl. No.: 781,178

[22] PCT Filed: Apr. 2, 1990

[86] PCT No.: PCT/GB90/00488
§ 371 Date: Nov. 1, 1991
§ 102(e) Date: Nov. 1, 1991

[87] PCT Pub. No.: WO90/12436
PCT Pub. Date: Oct. 18, 1990

[30] Foreign Application Priority Data

Mar. 31, 1989 [GB] United Kingdom ............... 8907304

[51] Int. Cl.$^5$ ............................................. H01S 3/19
[52] U.S. Cl. ......................................... 372/96; 372/46
[58] Field of Search ...................... 372/96, 44, 45, 46, 372/49

[56] References Cited

U.S. PATENT DOCUMENTS 4,775,980 10/1988 Chinone et al. ..................... 372/96
4,805,184 2/1989 Fiddyment et al. ................. 372/96

FOREIGN PATENT DOCUMENTS

0156566A1 10/1985 European Pat. Off. .
2339973 8/1977 France .
61-255085(A) 11/1986 Japan .
2209408A 5/1989 United Kingdom .

OTHER PUBLICATIONS

Heise et al., SPIE vol. 651 Integrated Optical Circuit Engineering III (1986), "Phase-shifted holographic gratings for distributed feedback lasers", pp. 87–91 (no month).
Patent Abstracts of Japan, vol. 11, No. 108, Apr. 4 1987, JP, A, 61255087, Nov. 12 1986.
Patent Abstracts of Japan, vol. 11, No. 217, Jul. 14, 1987, JP, A, 6235691, Feb. 16, 1987.
Journal of Lightwave Technology, vol. LT-4, No. 10, Oct. 1986, Yano et al, "Extremely Low-Noise Facet-Reflectivity-Controlled InGaAsp Distributed-Feedback Lasers", pp. 1454–1459.
Applied Optics, vol. 23, No. 1, Jan. 1, 1984, Einstein et al, "High quality antireflection coatings on laser facts by sputtered silicon nitride", pp. 161–164.
IEEE Journal of Quantum Electronics, vol. QE-12, No. 9, Sep. 1976, Haus et al, "Antisymmetric Taper of Disturbed Feedback Laser", pp. 532–539.
J. Appl. Phys., vol. 43, No. 5, May 1972, Kogelnik et al, "Coupled-Wave Theory of Distributed Feedback Lasers", pp. 2327–2335.

Primary Examiner—James W. Davie
Attorney, Agent, or Firm—Nixon & Vanderhye

[57] ABSTRACT

Improved single-modedness is achieved in distributed feedback (DFB) lasers by minimizing the feedback provided at or near the ends of the DFB grating. The feedback may be minimized at one or both ends of the grating. Feedback is controlled by reducing the coupling to the grating. Coupling is reduced by reducing the depth of the grating's teeth and/or by increasing the spacing of adjacent teeth.

15 Claims, 7 Drawing Sheets

Fig. 1.
(PRIOR ART)
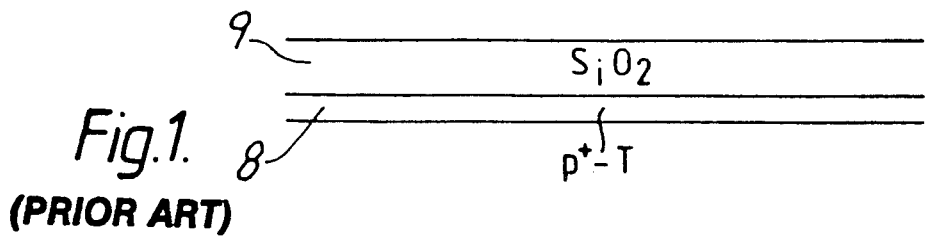
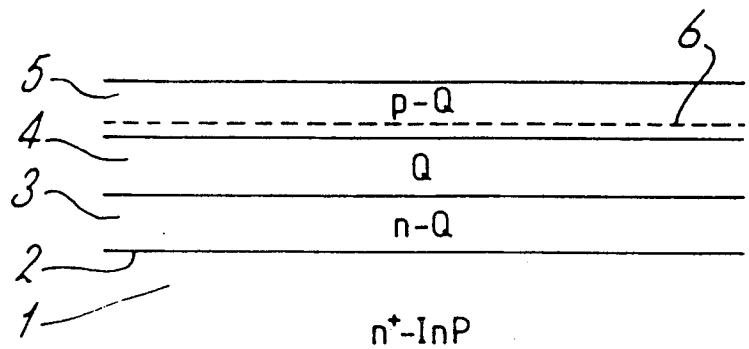
Fig. 2.
(PRIOR ART)
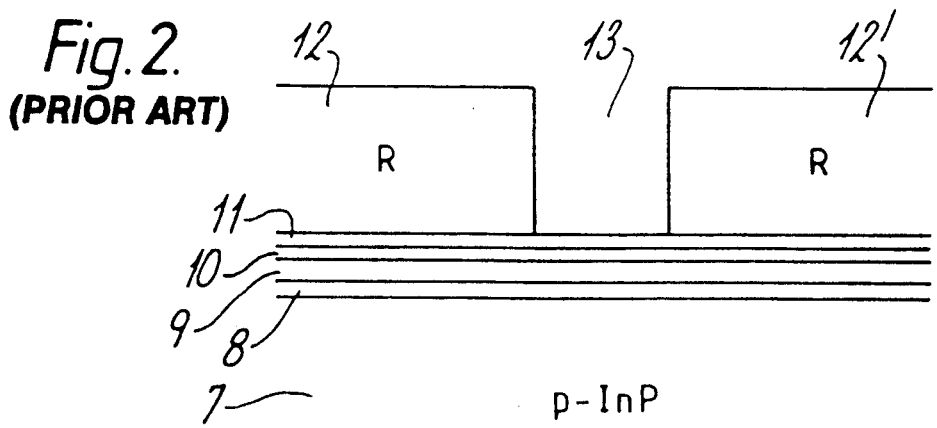
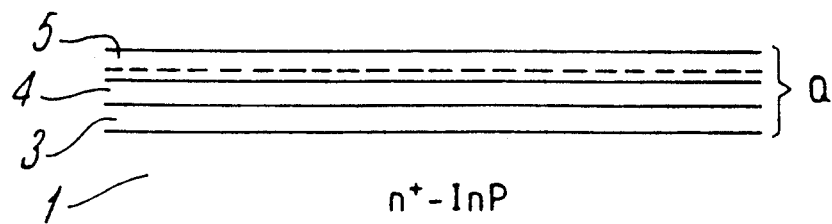

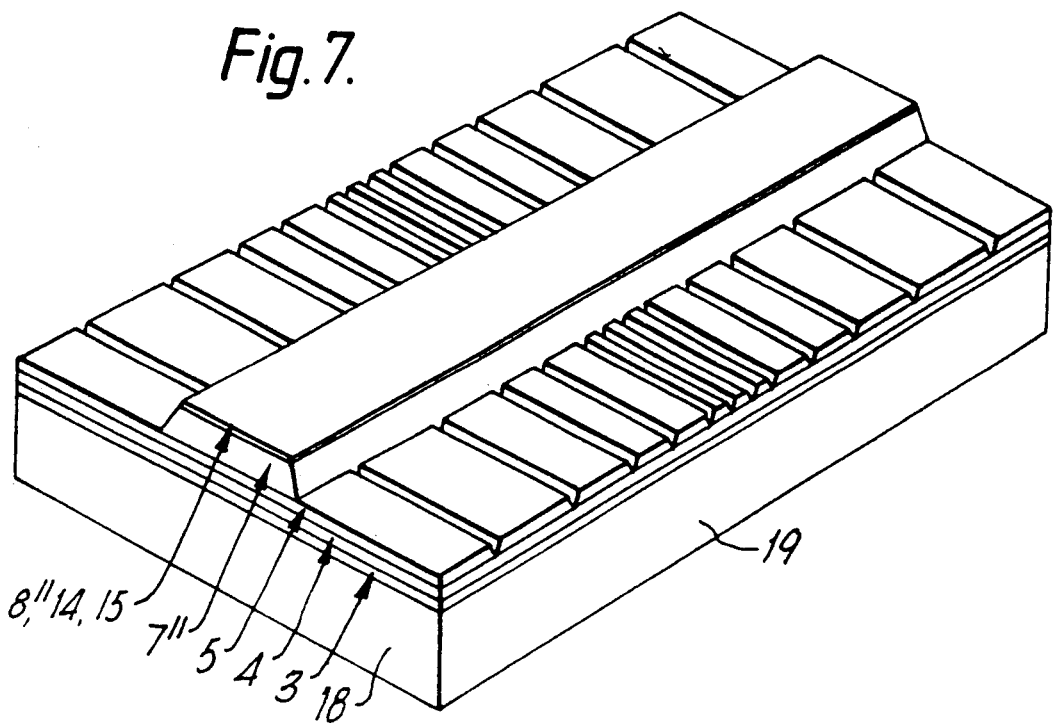
Fig. 7.
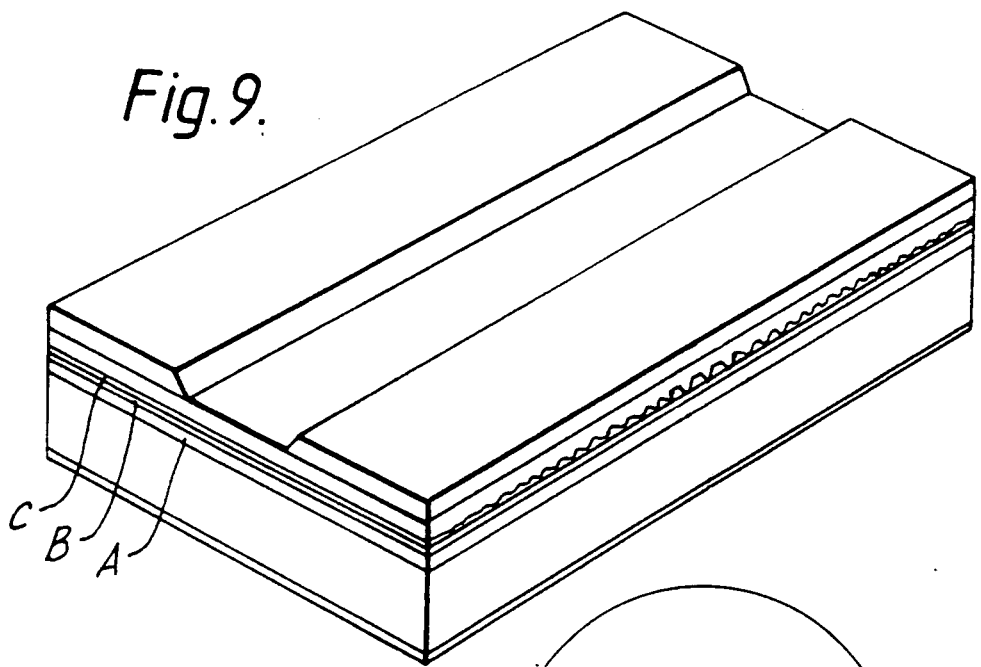
Fig. 9.
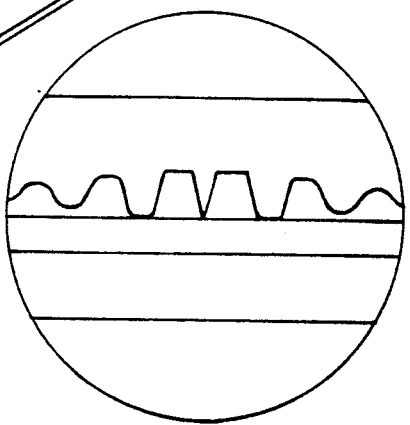
Fig. 9.a.

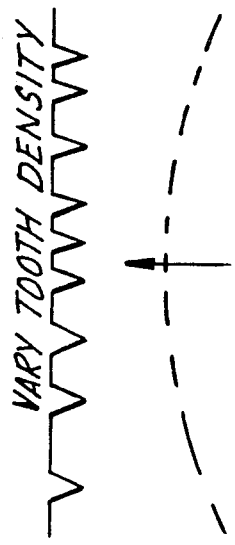
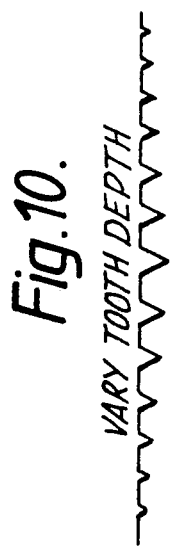
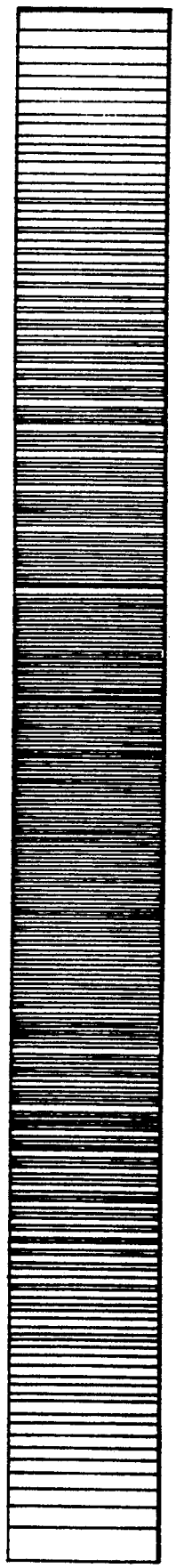

DISTRIBUTED FEEDBACK LASERS

FIELD OF THE INVENTION

The present invention relates to distributed feedback (DFB) lasers and in particular but not exclusively to DFB semiconductor injection lasers.

BACKGROUND OF THE INVENTION

DFB lasers do not utilise the cavity mirrors of conventional Fabry-Perot systems, but rather rely on backward Bragg scattering from periodic perturbations of the refractive index and/or gain of the laser medium to provide the optical feedback necessary for laser operation. DFB structures have the advantage of providing better frequency stability of the mode of oscillation than Fabry-Perot structures.

In semiconductor DFB lasers, the periodic perturbations are generally provided by means of a grating formed, usually, in a semiconductor layer adjacent the device's active layer, the teeth and grooves of the grating extending orthogonally to the device's optical axis. Typically the grating extends throughout the entire length of the laser, but in some devices the grating is shorter than the device, the grating ends being remote from the device ends.

The wavelength sensitivity of the Bragg effect results in DFB lasers exhibiting a high degree of spectral selection. The narrow linewidth of DFB lasers means that they are very attractive for use in optical communications systems, not least because of the effective increase in bandwidth that can be achieved as a result of the reduced dispersion consequent on the use of a narrower linewidth source. Unfortunately, however, the optical output of DFB lasers, while of narrow linewidth, is not absolutely monochromatic: generally two and sometimes three longitudinal modes will be supported simultaneously, the dominant mode having the highest intensity output. If the power difference between the dominant and subordinate modes is great enough, the laser's output can be considered for some purposes to be single mode. The problem lies in ensuring a sufficiently great power difference. Typically, the aim is to achieve side to main mode power ratios of—40 dB or better under the most severe operating conditions—in particular, under direct modulation.

As reported by Haus and Shank in IEEE Journal of Quantum Electronics, Vol. QE12, No. 9, pp 532–539, 1976, the mode spectrum of the original DFB laser as analyzed by Kogelnik and Shank (J. Appl. Phys., Vol. 43, pp 2327–2335, 1972) consisted of modes of equal threshold on either side of a gap at a 'centre' frequency. Haus and Shank note that this threshold degeneracy is a disadvantage in practical applications where single-mode operation at a predictable frequency is desired, and they show that antisymmetric tapering of the coupling coefficient of the period of the structure may be utilized to remove the threshold degeneracy. Haus and Shank established that all structures with an antisymmetric taper of K (the feedback parameter of Kogelnik and Shank) support a mode at the centre frequency of the local stopbands. This mode has a particularly low threshold when used in a laser copy.

Haus and Shank found that DFB lasers with a stepped-K structure, that is one with a phase shift between a first section of grating and a second section of grating, had no threshold degeneracy and had much better threshold discrimination between the fundamental mode and the first higher order mode. They also found the frequency separation between the dominant mode and the first order mode to be much greater for the stepped structure than for the uniform structure.

As a result of the work by Haus and Shank, DFB lasers are now made with phase-shifted gratings.

SUMMARY OF THE INVENTION

Ideally, the lengths of the first and second sections are each equal to half the total grating length.

While the use of phase-shifted gratings is distinctly beneficial, there is still a demand for DFB lasers with improved threshold discrimination between the fundamental mode and the first higher order mode. Accordingly, the present invention seeks to provide DFB lasers having a high level of threshold discrimination between the fundamental mode and the first higher order mode.

According to a first aspect of the present invention there is provided a distributed feedback laser wherein the means which provide the feedback necessary for laser operation are distributed throughout a major portion of the length of the laser, the level of feedback provided by said means varying throughout said major portion, characterised in that the feedback provided by said means at at least one of the ends of said major portion is minimised.

We have discovered that if, instead of the feedback being constant throughout the length of the means for providing the distributed feedback, it is modified by a function such that it is a maximum at or near the middle of the means and tends to zero at one or both of the ends of the means, improved mode discrimination can be achieved.

Preferably the function is such that there are no abrupt changes in feedback amplitude throughout the length of the means.

Preferably the means comprises a grating. Preferably the DFB laser is phase-adjusted. Preferably the phase adjustment is provided by means of a phase-shift in the means. Preferably the phase-shift occurs at or near the mid point along the length of the means.

According to a second aspect of the present invention, there is provided a distributed feedback laser wherein means are distributed throughout a major portion of the length of the laser to give optical feedback, the amount of feedback provided by said means varying throughout said major portion, characterised in that the amount of feedback varies without abrupt changes, the degree of feedback provided by said means tending to zero adjacent at least one of the ends of said portion.

According to a third aspect of the present invention, there is provided a distributed feedback laser wherein a grating is provided to give optical feedback, the optical coupling of the grating varying with position along its length, characterised in that throughout the length of the grating there are no abrupt changes in the degree of coupling, and in that adjacent at least one of the ends of the grating the coupling tends smoothly to zero.

A laser according to an embodiment of the present invention might have an operating wavelength of between 1.3 and 1.55 μm.

Following the work of Haus and Shank described above, others have considered how, other than by building a phase shift into the grating, phase-adjustment could be implemented in semiconductor DFB lasers. Sekartedjo, Broberg, Koyama, Furuya and Suematsu in Jap. J. Appl. Phys., Vol. 23, No. 10, 1984, pp 791–794, describe a phase-adjusted distributed reflector laser in which phase adjustment is accomplished by providing a trench 0.15 μm deep and 12 μm long across the width of the laser's grooved substrate (the device being approximately 800 μm long). Using liquid phase epitaxy (LPE) a buffer layer nominally 0.15 μm thick was grown over the grating, filling the trench (the LPE growth rate being higher in the trench). The device's active layer was then grown on the buffer layer using LPE, the remaining processing steps being conventional. The optical propagation constant over the trench is different to that in the rest of the waveguide, thereby producing a phase shift in the propagating wave..

Soda, Wakao, Sudo, Tanahashi and Imai have proposed, Electronics Lett. Vol. 20, No. 24, pp 1016–1018, a phase-adjusted DFB laser in which phase-adjustment is achieved as the result of differences in propagation constant between a 60 μm long phase-adjustment region which is wider or narrower than the bulk 'uniform' regions at either end of the laser. The difference in width between the propagation region and the 'uniform' regions is achieved by varying the stripe width. The corrugations of the grating are formed throughout the length of the device (400 μm) without a phase shift.

In none of the papers referenced above is there any suggestion that modifying the coupling of the grating in such a way that it tends to zero is in any way advantageous.

BRIEF DESCRIPTION OF THE DRAWINGS

Preferred embodiments of the present invention will now be described, by way of example only, with reference to the accompanying drawings in which:

FIGS. 1 to 5 are a series of sections in the same plane showing the stages in the production of a DFB laser of known type;

FIG. 7 is a similar perspective view of a DFB ridge waveguide laser according to the present invention, illustrating the new grating arrangement;

FIG. 8b is a plot of tooth density against position for the grating of FIG. 8a;

FIG. 9 is a similar schematic perspective view of a phase-shifted laser according to the present invention;

FIG. 9a is an enlarged view of a detail of the laser of FIG. 9;

FIG. 10 is a schematic view of a grating for use in a laser according to the invention, the grating providing non-uniform coupling as the result of variations in tooth depth;

FIGS. 11a and 11b are top and side views of an alternative grating for use in a laser according to the invention, the grating providing non-uniform coupling as the result of variations in tooth density;

DETAILED DESCRIPTION OF THE DRAWINGS

In the following description, and elsewhere in this specification, terms such as "on top of" and "underside" are used. These terms are used for convenience only and should not be taken to denote a particular orientation of any device unless it is clear from the context that a particular orientation is intended.

Figure 6:
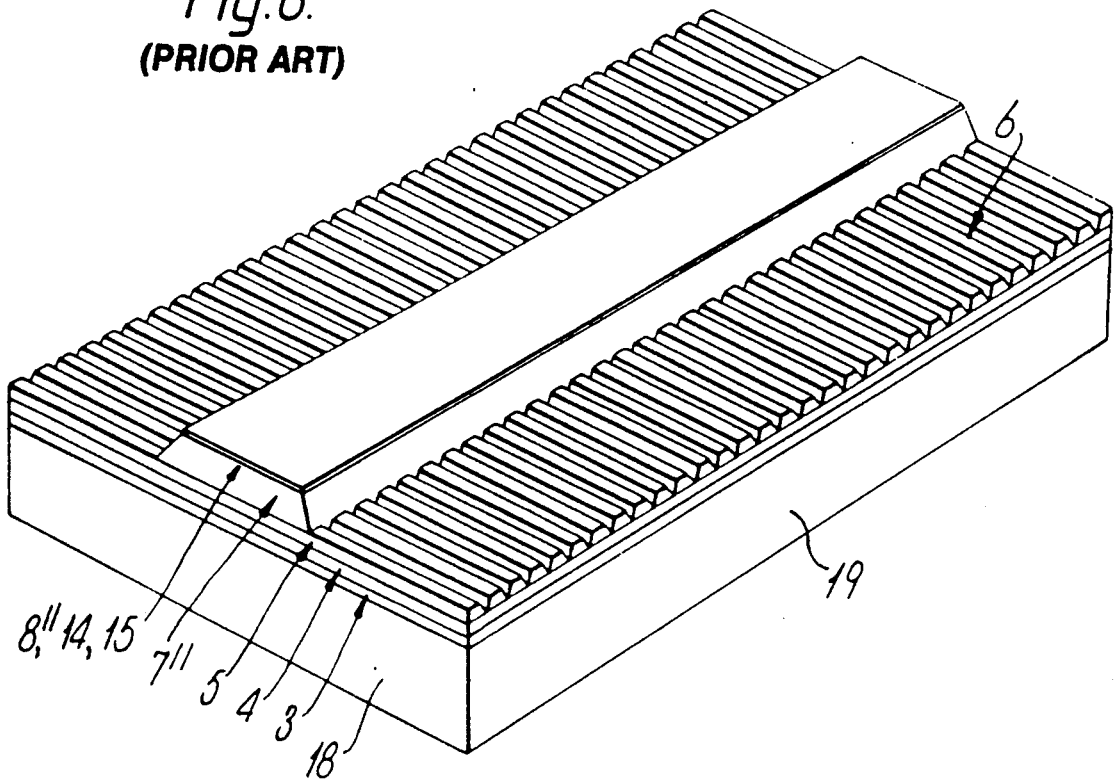
FIG. 6 is a partially exploded perspective view of a conventional ridge waveguide DFB semiconductor laser.

In FIG. 6 an example of a semiconductor DFB laser of conventional type, specifically a DFB ridge-waveguide laser as described in our European patent application 85301599.8, is shown, and it is in relation to this type of laser that the invention will be particularly described. It should be understood, however, that the present invention is equally applicable to other laser structures, including glass lasers and dye lasers, and particularly to other semiconductor laser structures, for example buried-heterostructure lasers and multiple quantum well lasers.

The first stages in the production of the device, as far as the section shown in FIG. 1, are as follows. Onto the (100) face (2 in FIG. 1) of a heavily S-doped InP (n+-type) substrate 1 approximately 200 μm thick were grown by liquid phase epitaxy (LPE) a series of three layers of quaternary materials 3, 4, and 5 each 0.2 μm thick. Layer 3 is Te-doped (n-type) of nominal composition $Ga_{0.17}In_{0.83}As_{0.36}P_{0.64}$ of band gap equivalent 1.15 um as determined by photoluminescence. Layer 4 is undoped material of nominal composition $Ga_{0.39}In_{0.61}As_{0.88}P_{0.12}$ of nominal band gap equivalent 1.52 um. Layer 5 is similar to layer 3 except that it is Zn-doped (p-type). Layer 4, it will be appreciated, is the active in the finished device and layers 3 and 5 are the lower and upper confinement (or "buffer") layers.

Next, layer 5 was corrugated by chemical etching through an electron-beam-exposed resist mask in the manner described by Westbrook et al, Electronics Letters, 1982, volume 18, pages 863–865. The distributed feedback corrugations 6 are second-order of nominal period 0.46 μm, running in the 110 direction, the etching being self-limiting and resulting in triangular grooves with (111)A side walls. The grooves are approximately 0.16 μm deep. The self-limiting nature of the etching process makes for reproducibility and control of the laser feedback strength.

Then corrugated layer 5 was overgrown with a layer 7 Zn-doped (p-type) indium phosphide by atmospheric pressure metal organic chemical vapour deposition (MOCVD) while maintaining the integrity of the gratings as previously described (European patent application 84.300240.3 and also Nelson et al, Electronics Letters, 1983, volume 19, pages 34 to 36). To achieve this, trimethylindium, triethylphosphine, dimethylzinc, phosphine, and hydrogen were passed over the sample at 100° C. and the sample was heated rapidly to 650° C. whereupon growth occurred. Layer 7 was approximately 1.5 um thick.

Then, also by MOCVD, a layer 8 approximately 0.1 um thick of heavily Zn-doped (p+-type) ternary material was grown. The material had the nominal composition $In_{0.53}Ga_{0.47}As$.

To complete the structure of FIG. 1, a layer 9 of silica, 0.2 um thick, was grown on top of layer 8 by chemical vapour deposition from silane and oxygen.

Then the substrate was thinned to 100 um by chemical etching, and the back contact of the laser (i.e. the contact on the underside of thinned layer 1) was made by evaporation of tin and gold and subsequent alloying.

The immediately subsequent treatment of the upper layers, as far as FIG. 2, was as follows. 0.1 um of titanium (layer 10) and 0.1 um of gold (layer 11) were evaporated onto the silica layer 9. Then about 1 um of a positive resist Kodak 820 was applied to the gold and a dark field mask at right angles to the grating was used to make a stripe window 13 between areas of resist 12 and 12'. Windows of 2 um, 4 um, 6 um, and 15 um were made on a single wafer.

The steps as far as FIG. 3 were as follows. The structure was exposed to an solution of potassium iodide (4 g) and iodine (1 g) in 40 ml of water at 20° C. for 1 to 1½ minutes (which etchant attacks gold layer 11) and to "Countdown silicon dioxide etch (10:1)" for 2 to 2½ minutes at 20° C. (which etchant attacks titanium layer 10 and silica layer 9). The result was an undercut etching down to the top layer 8 of semiconductor material. By exposing this sequentially to filaments of evaporating titanium and gold, an image 14, 15 of the window was obtained on the exposed semiconductor. At the same time, titanium layers 16, 16' and gold layers 17, 17' were deposited on top of the resist 12, 12'. The wire filaments used were 10 cm away from the target and the thickness of each metal deposited was about 0.1 um.

Figure 3:
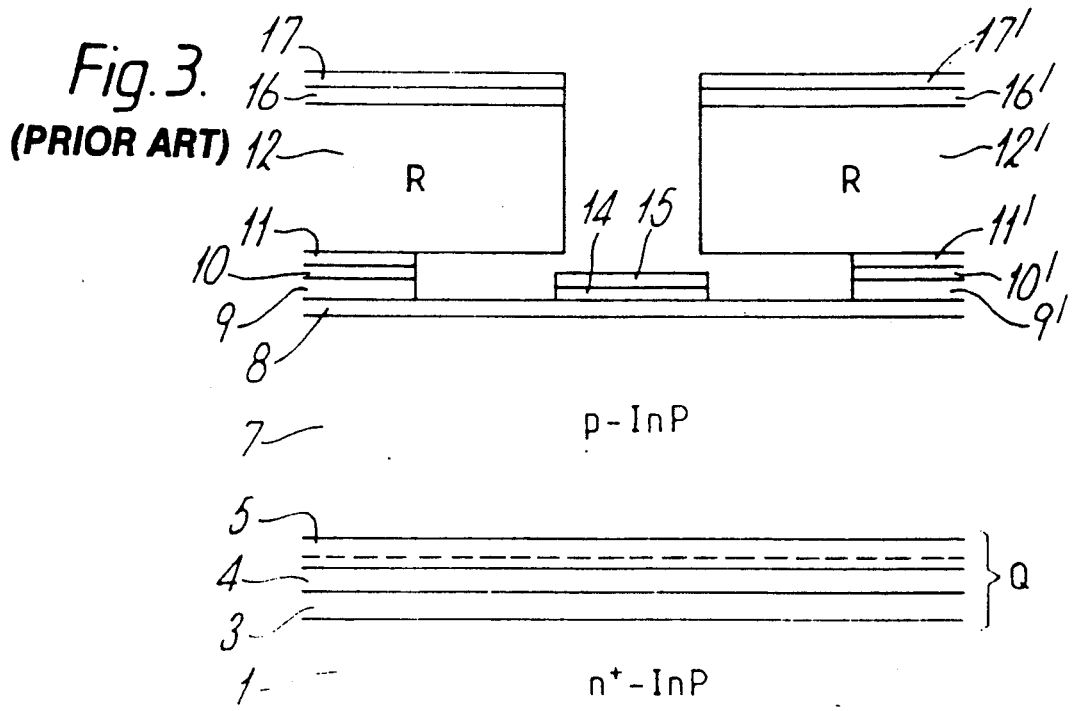
Figure 4:
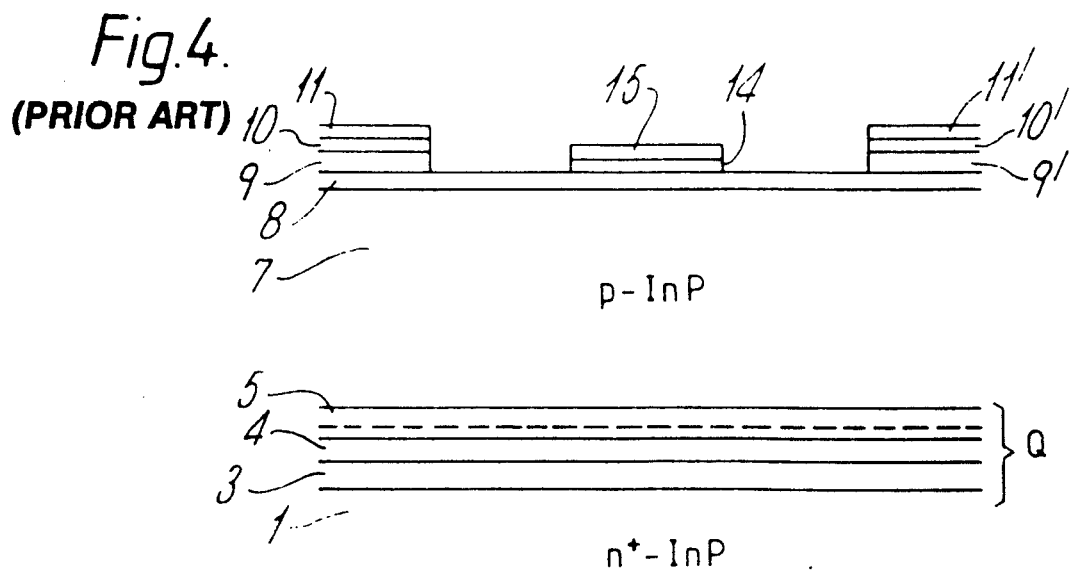

Then the structure shown in FIG. 3 was soaked in acetone for two minutes so as to remove the resist 12, 12' and therewith layers 16, 16', 17, and 17'. The result as shown in FIG. 4 is an "initial semiconductor structure" as referred to with respect to the second aspect of the invention carrying two sequential layers of metal comprising sub-layers 14 and 15 and separate layers of dielectric 9 and 9', which latter are themselves in this case overlaid with metal 10 and 11 and 10' and 11'. The distance between the edges of the metal layers 14, 15 and the edge of the dielectric 9, 9' was approximately 4 um.

Figure 5:
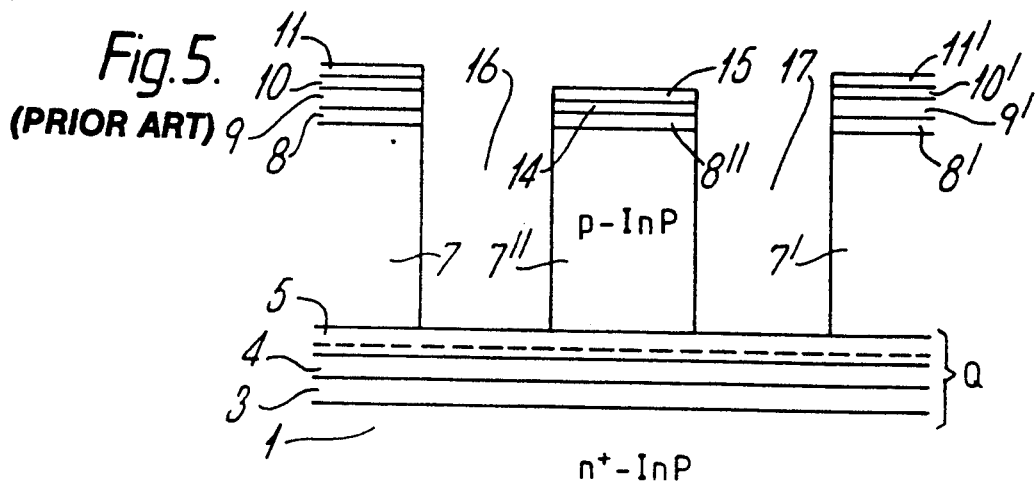

By treating this structure with 16 weight per cent aqueous $HIO_3$ at 20° C. for 20 seconds to 1 minute (to attack ternary layer 8) and then with a 1:1 mixture by volume of concentrated hydrochloric acid and 90 per cent orthophosphoric acid at 20° C. for 30 to 40 seconds (to attacking quaternary layer 5), the result shown in FIG. 5 is received.

In FIG. 5, the etching through layers 8 and 7 has been shown as vertical, although in practice this is unlikely to be the case. It will be seen that, in the terminology previously used, the base semiconductor portion is constituted by layers 1, 3, 4, and 5; the first elevated semiconductor portion (constituting the ridge of the laser) by 7'' and 8''; the second elevated semiconductor portions by 7 and 8; and the third by 7' and 8'. It will be noted that while the first such portion carries metal layers titanium 14 and gold 15 in electrical contact therewith the other portions carry the dielectric silica 9 and 9'. The insides of channels 16, 17 are substantially free of dielectric and metal.

As is conventional, all the steps above were in fact performed on a wafer which was then cut up to yield several devices, a single such device being shown schematically in FIG. 6. In FIG. 6, the second and third elevated semiconductor portions are omitted so as to show clearly the relative orientation of the ridge and the grating. The reference numerals up to 15 have the same significance as previously. Facet 18 of the device is a cleaved facet, the other three side facets such as 19 being treated (scribed or AR coated) so as to suppress Fabry-Perot laser modes other than the mode selected by the DFB grating.

Figure 8A:
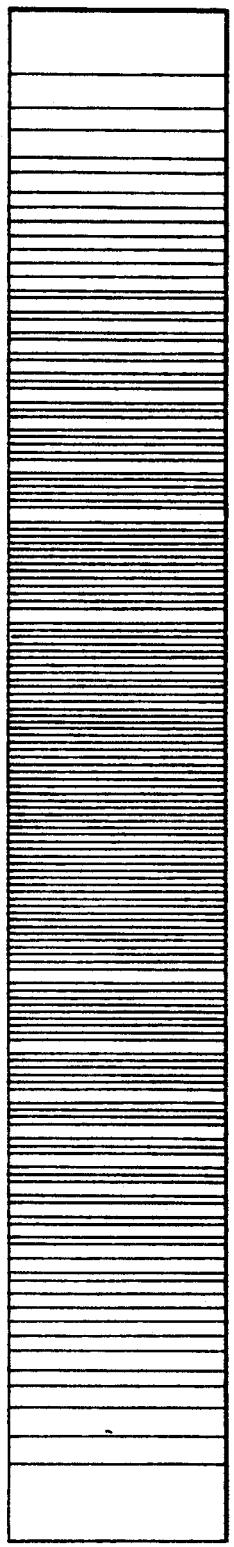
FIG. 8a is a schematic plan view of the grating of the laser shown in FIG. 7.
Figure 8B:
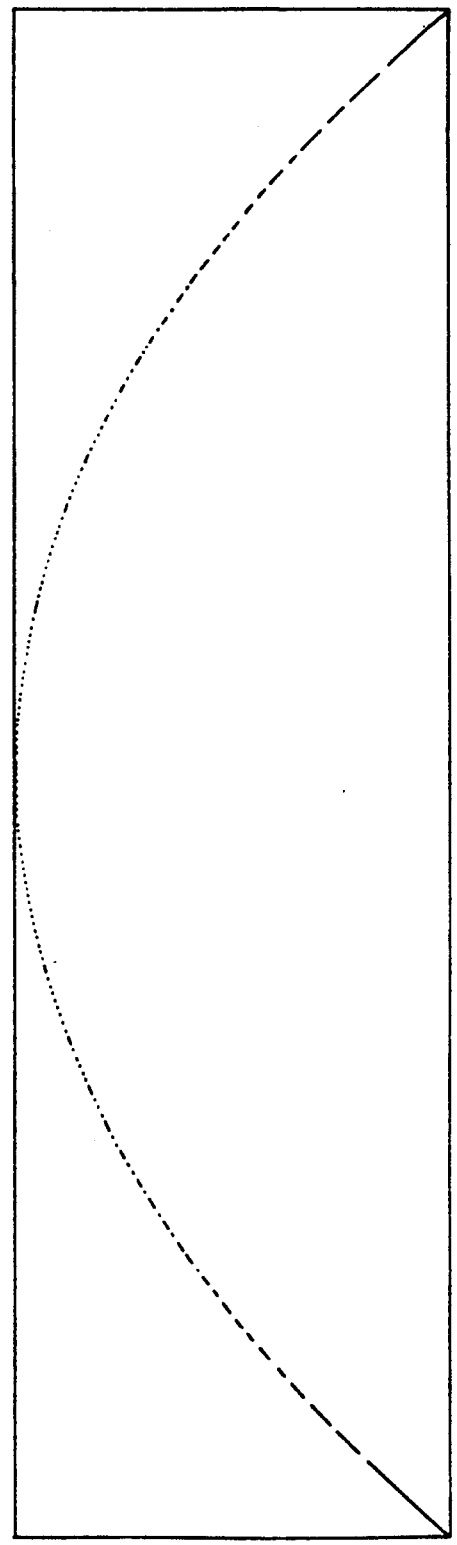

FIG. 7 shows schematically one embodiment of the present invention. As is clear from a comparison of FIGS. 6 and 7, in this embodiment of the invention, the tooth density of the grating varies along the grating's length. By reference to FIGS. 8a and 8b, it can be seen that the tooth density varies parabolically, with tooth spacing increasing towards each end of the grating. It should be noted that the tooth spacing is not in fact a continuous variable; the spacing between adjacent teeth centres is an integer times the fundamental Bragg period.

FIG. 9, a buried heterostructure laser according to the invention is shown with a grating similar to that shown in FIG. 8 apart from the incorporation of a phase shift at its mid-point.

The end facets of the devices shown in FIGS. 8 and 9 are antireflection coated. In general it is preferable to have as low a reflectivity as possible, because the benefit of devices according to the invention is increased as facet reflectivity is reduced, at least down to 0.1 percent. Preferably, therefore, facet reflectivities of 1 percent or less are used. More preferably, the facet reflectivities are less than or equal to 0.5 percent. Still more preferably, the facet reflectivities are 0.1 percent or less. All reflectivities in this specification are determined at an operating wavelength of the device, as is conventional.

As an alternative to varying tooth spacing, grating coupling may be varied according to the invention by varying tooth depth. A schematic example of this approach is shown in FIG. 10. If electron-beam lithography is used in the grating definition process, a grating in which tooth depth varies, as shown in FIG. 10, may be produced by varying the e-beam exposure dose. A schematic sectional view of the alternative structure, in which coupling is varied by varying tooth separation also shown in FIG. 8, is shown in FIG. 11.

Figure 12:
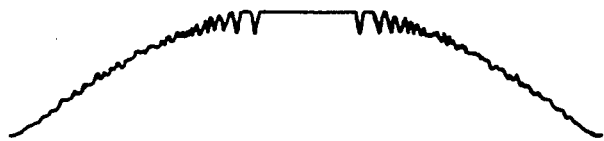
FIG. 12 is a plot of effective e-beam exposure does received by DFB grating lines when a parabolic weighting function is used without correction for proximity effects.
Figure 13:
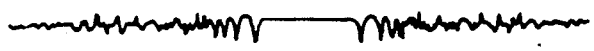
FIG. 13 is a similar plot showing the effect of correcting for proximity effects.

Using electron-beam lithography, this form of grating is produced with a uniform e-beam dose with an appropriate exposure pattern (in effect, grooves/teeth are left out with increasing frequency as the grating ends are approached). The proximity effects which are experienced in electron-beam lithography mean that using the same e-beam dose in writing each line results in lower exposure for lines which are widely spaced than for those which are more closely spaced. FIG. 12 illustrates the effective exposure dose received by DFB grating lines when a parabolic weighting function is used and no correction is made for proximity effects. The lowest exposure is received by lines towards the end of the grating which receive only 73 percent of the peak exposure dose. Such an approach results in faint, uneven or missing grating lines. This problem can be overcome by using as near as possible a uniform e-beam dose in writing the grating. FIG. 13 illustrates the effective exposure dose received by a DFB grating (with the same parabolic weighting function as that used for FIG. 12) when proximity effect correction is used. By increasing the writing time for lines at the end of the grating the worst case (minimum) exposure has been increased to 94.4 percent of the peak exposure dose, resulting in a much more uniform etching of grating lines. Since this approach is very easy to implement it is the preferred approach.

It is of course possible to vary grating coupling by combining tooth depth and density variations.

Grating coupling may be varied in a yet further way, by directly varying the refractive index of the layer (waveguide) in which the grating is formed. The refractive index may for example be varied by means of a local implant of diffusion of some index-controlling material. With such an approach, a conventional grating structure could be used.

Figure 14:
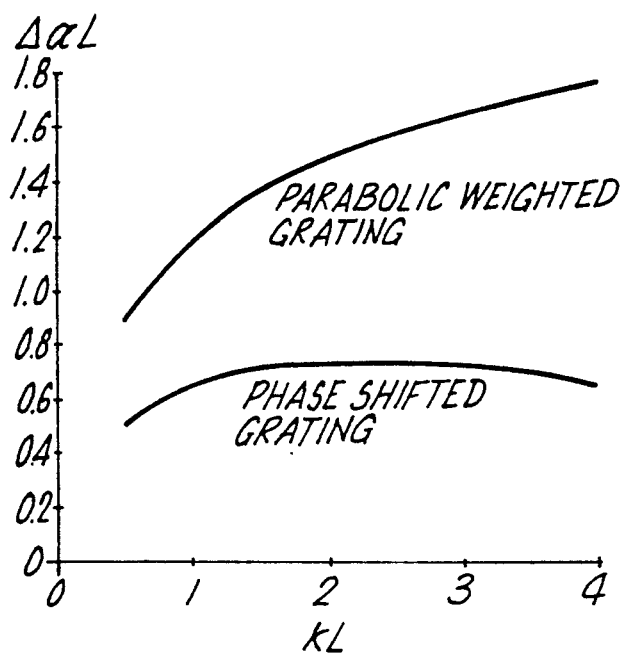
FIG. 14 shows gain difference measured as a function of KL for conventional PSDFB lasers and those according to the present invention.
Figure 15:
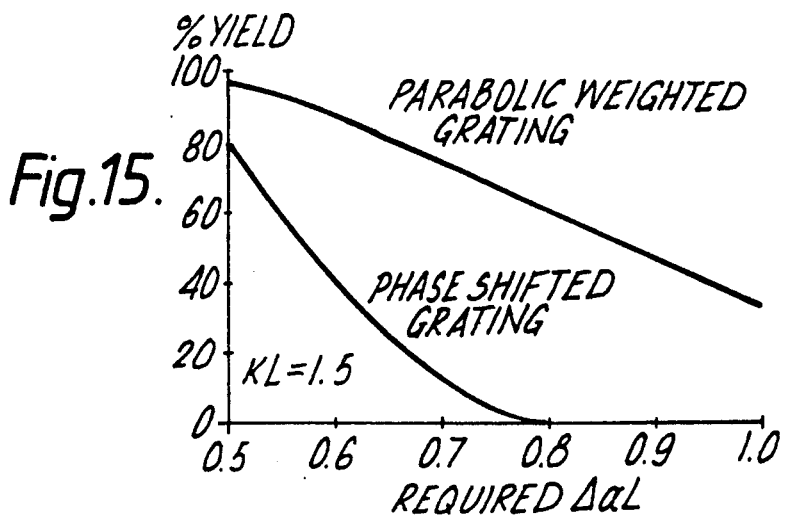
FIG. 15 shows yields of devices satisfying a given $\Delta\alpha.L$ requirement for conventional PSDFB and those according to the present invention.

The present invention is based on our appreciation that if the level of feedback is gradually reduced to zero at the ends of a laser grating, the side modes are suppressed, increasing the theoretical gain difference, MSR and single mode device yield (that is the percentage of devices from a given wafer which are in fact useably single moded). Our calculations have also shown that by combining this weighting with a central phase shift, a much larger mode suppression ratio can be achieved than is possible using the phase shift alone. FIG. 14 shows the gain difference $\Delta\alpha.L$ between the principal lasing mode and the strongest side-mode calculated as a function of KL for phase shifted structures of this type, together with similar calculations for a conventional phase shifted DFB laser, assuming zero facet reflectivity. As can be seen from this figure, $\Delta\alpha.L$ for these non-uniform gratings is more than twice that for the simple phase-shifted DFB (PSDFB) at KL=2, and continues to rise at larger KL. This increase in $\Delta\alpha.L$ leads to a substantially larger single-mode suppression ratio. FIG. 15 shows the percentage yield of devices satisfying a given $\Delta\alpha.L$ requirement, again calculated for weighted and uniform PSDFB structures, assuming a residual facet reflectivity of 0.3 percent (a typical facet reflectivity for AR coated facets of modest quality) and a random distribution of facet phases. As those skilled in the art will appreciate, a low but non-zero residual facet reflectivity will tend to improve the single-modedness of uniform PSDFB devices, but will tend to reduce the benefits of the present invention relative to the performance of equivalent devices having zero facet reflectivities. Despite this, it is clear from this graph that non-uniform gratings of this type (according to the present invention) produce much higher yields of devices with large $\Delta\alpha.L$ than are achievable with uniform PSDFB structures.

So far the invention has been described with reference to symmetrical grating structures, in which coupling is reduced equally towards each end of the grating. There are, however, applications where it would be advantageous if the grating had an assymmetrical structure. In particular there would be advantages in having grating coupling tending to zero at only one end of the grating.

As has already been mentioned, the present invention may be realised in some form other than a semiconductor laser, such as, for example, a dye laser or a doped-glass laser.

For the avoidance of doubt, it should be noted that the terms distributed feedback laser and DFB laser used in this specification are not to be taken as referring to distributed bragg reflector (DBR) lasers.

In DBR lasers the grating region is spaced, in the direction of propagation (z), from the active region. In effect the grating or gratings function as wavelength-selective mirrors spaced, in the direction of propagation, from the active region. Conversely, in DFB lasers the grating, while generally spaced in the X or Y direction from the active layer, lies parallel to the active layer throughout the entire grating length (but not necessarily throughout the entire active layer length).

We claim:

1. A distributed feedback laser comprising a laser medium and optical feedback to said laser medium, the optical feedback comprising periodic perturbations of the refractive index and/or gain of the laser medium, wherein said periodic perturbations are provided in a grating region which is distributed along the laser, the level of feedback provided by said perturbations varying throughout said grating region, characterised in that said level of feedback tends to zero at at least one of the ends of said grating region.

2. A laser as claimed in claim 1 wherein in use, substantially all the optical feedback to said laser medium is provided by said perturbations.

3. A laser as claimed in claim 1 or claim 2, wherein the amount of feedback provided throughout said grating region varies without abrupt changes.

4. A laser as claimed in claim 1 wherein said perturbations are provided by a grating having tooth depth and spacing, and said variation in the level of feedback provided by said perturbations is the result of the tooth depth of said grating varying along the length of the grating.

5. A laser as claimed in claim 1, wherein said perturbations are provided by a grating having tooth depth and spacing, and said variation in the level of feedback provided by said perturbations is the result of the tooth spacing of said grating varying along the length of the grating.

6. A laser as claimed in claim 4, wherein said variation in the level of feedback provided by said perturbations is the result of both the tooth depth and the tooth spacing of said grating varying along the length of the grating.

7. A laser as claimed in any one of claims 4, 5 or 6 wherein said grating region extends along substantially the entire length of the laser.

8. A laser as claimed in claim 1, wherein said laser comprises a semiconductor injection laser.

9. A laser as claimed in claim 8 having at least one optical facet which is antireflection coated and which has a reflectivity at an operating wavelength of said laser which is one percent or less.

10. A laser as claimed in claim 8, said laser comprising an active layer and a waveguiding layer, wherein the amount of feedback provided throughout said grating region varies without abrupt changes and wherein said perturbations are provided by a grating formed in one surface of said waveguiding layer, variations in the thickness and/or width of the waveguiding layer resulting in said feedback variation.

11. A laser as claimed in claim 8 wherein said laser comprises a ridge-waveguide structure.

12. A laser as claimed in claim 8 wherein said laser comprises a buried-heterostructure.

13. A laser as claimed in claim 8 comprising an indium phosphide substrate.

14. A laser as claimed in claim 8, said laser having an operating wavelength of between 1.3 and 1.55 $\mu$m.

15. A distributed feedback laser comprising a laser medium and optical feedback to said laser medium, wherein a grating provides said optical feedback, the optical coupling of said grating varying with position along its length, characterised in that throughout the length of said grating there are no abrupt changes in the degree of coupling, and in that adjacent at least one of the ends of said grating the coupling tends smoothly to zero.

* * * * *